United States Patent
Fukunaga et al.

(10) Patent No.: US 6,423,102 B1
(45) Date of Patent: *Jul. 23, 2002

(54) JIG USED FOR ASSEMBLING SEMICONDUCTOR DEVICES

(75) Inventors: Satoru Fukunaga; Hiroyuki Nakanishi, both of Tenri (JP)

(73) Assignee: Sharp Kabushiki Kaisha, Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/987,054

(22) Filed: Dec. 9, 1997

Related U.S. Application Data

(63) Continuation of application No. 08/442,773, filed on May 17, 1995, now abandoned.

(30) Foreign Application Priority Data

Nov. 30, 1994 (JP) ................................ 6-297059

(51) Int. Cl.⁷ ..................... H01L 21/00; H01L 21/64; B25B 11/00
(52) U.S. Cl. ..................... 29/25.01; 269/21; 277/910
(58) Field of Search .................... 29/25.01; 269/21; 277/910

(56) References Cited

U.S. PATENT DOCUMENTS

| | | | |
|---|---|---|---|
| 2,730,370 A | * | 1/1956 | Brewster |
| 4,357,006 A | * | 11/1982 | Hayes |
| 4,470,856 A | * | 9/1984 | Little et al. |
| 4,763,188 A | | 8/1988 | Johnson |
| 4,795,518 A | | 1/1989 | Meinel et al. |
| 4,949,783 A | * | 8/1990 | Lakios et al. |
| 4,968,375 A | * | 11/1990 | Sato et al. |
| 5,034,350 A | | 7/1991 | Marchisi |
| 5,147,815 A | | 9/1992 | Casto |
| 5,173,766 A | | 12/1992 | Long et al. |
| 5,273,938 A | | 12/1993 | Lin et al. |
| 5,366,933 A | | 11/1994 | Golwalkar et al. |
| 5,437,777 A | * | 8/1995 | Kishi |
| 5,527,740 A | | 6/1996 | Golwalkar et al. |
| 5,759,873 A | * | 6/1998 | Kata et al. |

FOREIGN PATENT DOCUMENTS

| | | |
|---|---|---|
| EP | 4026244 | 2/1992 |
| JP | 58110048 | 6/1983 |
| JP | 58142537 | 8/1983 |
| JP | 6191936 | 5/1986 |
| JP | 62219531 | 9/1987 |
| JP | 1218032 | 8/1989 |
| JP | 5121462 | 5/1993 |

* cited by examiner

Primary Examiner—David E. Graybill

(57) ABSTRACT

A jig used for assembling semiconductor devices has an arrangement wherein the first semiconductor integrated circuit chip, which is die-bonded and wire-bonded onto one surface of a lead frame, is fitted to the inner section of a support stage and is supported by an elastic member that is designed to be higher than the inner section, while the lead frame is supported by the outer section of the support stage. In this state, the second semiconductor integrated circuit chip is die-bonded onto the other surface of the lead frame by applying pressure by means of a bonding collet. Thus, it becomes possible to prevent cracks that may be caused in a passivation film and also to improve the reliability and the final yield of semiconductor devices.

10 Claims, 9 Drawing Sheets

1ST DIE BONDING
(FORM PROTECTIVE RESIN FILM ON CHIP-SURFACE)

FIG.7(b) 2ND DIE BONDING

FIG.7(c) 1ST WIRE BONDING

FIG.7(d) 1ST WIRE BONDING

FIG.7(e) 2ND DIE BONDING

FIG.7(f) 2ND WIRE BONDING

JIG USED FOR ASSEMBLING SEMICONDUCTOR DEVICES

This application is a continuation of application Ser. No. 08/442,773, filed on May 17, 1995, abandoned, the entire contents of which are hereby incorporated by reference.

FIELD OF THE INVENTION

The present invention relates to a technique for conducting die-bonding and wire-bonding operations while supporting a circuit-bearing surface of a semiconductor integrated circuit chip in a die-bonding process as well as in a wire-bonding process for the semiconductor integrated circuit chip, and more specifically concerns a jig used for assembling semiconductor devices which is capable of reducing damages to the circuit-bearing surface of the semiconductor integrated circuit chip and a manufacturing method for semiconductor devices wherein such a jig is used.

BACKGROUND OF THE INVENTION

In general, semiconductor integrated circuit chips (hereinafter, referred to as "chips") are produced as follows: First, a chip is die-bonded onto a die pad of a lead frame through Ag paste, and after the Ag paste has been cured, bonding pads, formed on the chip, are wire-bonded to inner leads of the lead frame by the use of bonding wire or other members. After having sealed these with sealing materials such as resins and ceramics, tie bars and side bars are cut off, and outer leads are bent into desired shapes; thus, the chip is completed.

In recent years, there have been increasing demands for high-density, thin ICs, and in order to meet these demands, there have been proposed ICs wherein chips are bonded on both the back and surface sides of a lead frame. As shown in FIG. 8(a), in a die-bonding operation and a wire-bonding operation of such chips, the first chip 24a is die-bonded by a bonding collet 29 onto a die pad 23a on the first-surface side of a lead frame 22 that has been mounted on a support stage 25, in the same manner as the normal process, and the Ag paste is cured.

Next, as shown in FIGS. 8(b) through 8(d), the chip 24a is clamped by a heater block 30 and a clamp plate 31, and is fixed by applying a vacuum suction onto the back surface of the first-surface side die pad 23a through a suction hole 32. Then, while applying heat, the bonding pads of the first chip 24a and the inner leads on the first-surface side of the lead frame 22 are wire-bonded to each other through bonding wires 26.

Then, the lead frame 22 is turned over to be upside down, and as shown in FIG. 8(e), the second IC chip 24b is die-bonded onto a die pad 23b on the second-surface side of the lead frame 22 that has been mounted on a support stage 45 by using a bonding collet 29. The support stage 45 has a groove section 28a that is provided for preventing the first chip 24a that has been subjected to the die-bonding and wire-bonding from contacting the bonding wires 26, an inner section 45a for supporting the surface of the first chip 24a, and an outer section 45b for supporting the lead frame 22.

As shown in FIGS. 8(f), 8(g) and 8(h), after the Ag paste has been cured, this is clamped by a heater block 50 and the clamp plate 31. The heater block 50 has a groove section 28b that is provided for preventing the first chip 24a that has been subjected to the die-bonding and wire-bonding from contacting the bonding wires 26, an inner section 50a for supporting the surface of the first chip 24a, a suction hole 52 that is formed in the inner section 50a, and an outer section 50b for supporting the lead frame 22. Then, while applying a vacuum suction onto the surface of the first chip 24a through the suction hole 52 so as to fix the chip therein, as well an applying heat, the bonding pads on the surface of the second chip 24b and the inner leads of the lead frame 22 are wire-bonded to each other through bonding wires 26.

After having sealed the first chip 24a and the second chip 24b with sealing materials such as resins and ceramics at the same time, tie bars and side bars are cut off, and outer leads are bent into desired shapes; thus, the product is completed.

Moreover, another method has been proposed by Japanese Patent Publication No. 121462/1993 (Tokukaihei 5-121462).

After the first chip has been die-bonded onto a die pad on the first-surface side of a lead frame and the Ag paste has been cured, inner leads on the first-surface side and the bonding pads of the first chip are wire-bonded to each other through bonding wires, and only the inner leads on the first-surface side and the first chip are subjected to a resin-sealing process beforehand.

Next, the lead frame is turned over to be upside down, and after the second chip has been die-bonded onto the second-surface side of the lead frame and the Ag paste has been cured, inner leads on the second-surface side and the bonding pads of the second chip are wire-bonded to each other through bonding wires, and then the inner leads on the second-surface side of the lead frame and the second chip are subjected to a resin-sealing process.

In these methods, however, when the die-bonding operation and the wire-bonding operation are carried out on the second chip 24b of the lead frame 22, the circuit-bearing surface of the first chip 24a of the lead frame 22 needs to be contacted and supported by the inner section 45a of the support stage 45 and the inner section 50a of the heater block 50; this causes a pressure onto the circuit-bearing surface, resulting in the following problems.

Here, FIGS. 9(a) and 9(b), which explain a principle as to how cracks develop in a passivation film 33 during the forming process by the die-bonding and wire-bonding jig used in the conventional technique, are enlarged drawings, each of which shows a contacting and supporting section between the circuit-bearing surface of the first chip 24a of the lead frame 22 and the surface of the inner section 45a of the support stage 45 or the surface of the inner section 50a of the heater block 50.

As shown in FIG. 9(a), the passivation film 33 having a film-thickness of approximately 1 $\mu$m is coated on the circuit-bearing surface of the first chip 24a, and serves an a final protective film. Here, it is actually inevitable to have minute protrusions and recessions on the surface of the inner section 45a of the support stage 45 (hereinafter, referred to as "the first supporting face") as well as on the surface of the inner section 50a of the heater block 50 (hereinafter, referred to as "the second supporting face") due to their machining processes, and the biggest protrusion 35, located thereon, partially comes into contact with the passivation film 33. As a result, a die-bonding load as well as a wire-bonding load is locally applied onto the passivation film 33, and this tends to cause a crack 36 due to concentration of stress.

Moreover, as shown in FIG. 9(b), if there is foreign matter, such as silicone fragments, having a comparatively high hardness and having sharp shapes between the passivation film 33 and the first supporting face or the second supporting face, the biggest foreign matter 34, located thereon, partially comes into contact with the passivation film 33. As a result, a die-bonding load as well as a wire-bonding load is locally applied onto the passivation film 33, and this tends to cause a crack 36 due to concentration of stress.

Here, the concentration of stress, which forms a main cause of the crack 36, is caused and developed mainly due to the fact that the first supporting face and the second supporting face are made of a rigid material such as a metallic material of iron group.

Cracks caused in the passivation film tend to reduce the humidity resistance of the chip, and those chips containing cracks tend to be extracted as defective ones during electrical-characteristic tests and reliability tests that are carried out after they have been sealed with resin; this results in a reduction in the final yield of the chips.

Furthers in the method of the above-mentioned Japanese Patent Publication No. 121462/1993 (Tokukaihei 5-121462), those processes, such as die-bonding, Ag-paste curing, wire-bonding and resin-sealing processes, need to be carried out on the first surface of the lead frame; this requires two times of resin-sealing processes in a separated manner, resulting in an increase in the number of the processes. Moreover, when die-bonding and wire-bonding operations are conducted on the second surface of a lead frame whose first surface has already been subjected to the resin-sealing process, the resin sealing the first surface tends to become a source of contamination, thereby giving adverse effects on the working environment wherein the die-bonding and wire-bonding operations are carried out.

SUMMARY OF THE INVENTION

The objective of the present invention is to provide a means for preventing cracks that tend to be caused in a passivation film that is coated on the circuit-bearing surface on the first chip that has already been die-bonded and wire-bonded onto the first surface of a lead frame, when the second chip is die-bonded and wire-bonded onto the second surface of the lead frame, and thereby for improving the reliability of the chips as well as the final yield there of.

In order to achieve the above-mentioned objective, the Jig used for assembling semiconductor devices of the present invention is provided with a rigid member for supporting a lead frame to which the first semiconductor integrated circuit chip has been bonded on its one surface from said surface side, and an elastic member for supporting the semiconductor integrated circuit chip from said surface side. With this arrangement, when the second semiconductor integrated circuit chip is die-bonded and wire-bonded onto the other surface of the lead frame, the elastic member makes it possible to alleviate concentration of stress that is applied onto the passivation film on the circuit-bearing surface of the first semiconductor integrated circuit chip through its elastic deformation. Consequently, it becomes possible to prevent cracks that are caused In the passivation film, and also to improve the reliability of semiconductor devices. Moreover, it is possible to improve the final yield after all the manufacturing processes.

Further, when the elastic member is arranged to contact the first semiconductor integrated circuit chip at its inner side than the wire-bonding member, it becomes possible to prevent the elastic member from unnecessarily intervening the wire-bonding member.

Moreover, when the elastic member is designed to have a ring shape, it becomes possible to reduce the contact area between the passivation film and the elastic member and also to allow the elastic member to be easily maintained at a predetermined position. Furthermore, when the elastic member is designed to have a round shape or an elliptic shape in its cross-member, it becomes possible to further reduce the contact area between the passivation film and the elastic member. Here, as for materials for the elastic member, it is preferable to use those materials that have elasticity to a bonding load that is applied by the bonding collet.

Furthermore, the rigid member may be designed so that it has an outer section for supporting a lead frame and an inner section that is formed to have a height lower than that of the elastic member, that is, to be located at a position corresponding to a lower part of the first semiconductor integrated circuit chip with the outer section supporting the lead frame to which the first semiconductor integrated circuit chip has been bonded, and so that the ring-shaped elastic member is fit to the inner section. With this arrangement, the elastic member is able to prevent the lead frame from contacting the inner section that is one portion of the rigid member. As a result, it is possible to prevent cracks that may be caused in the passivation film due to minute protrusions that are located on the rigid member. Further, even if foreign matter, such as silicone fragments, exist between the circuit-bearing surface of the first semiconductor integrated circuit chip and the rigid member, it is possible to alleviate concentration of stress that is applied onto the passivation film on the circuit-bearing surface of the first semiconductor integrated circuit chip through its elastic deformation, thereby making it possible to prevent cracks that may be caused in the passivation film.

In order to achieve the above-mentioned objective, another jig used for assembling semiconductor devices of the present invention is provided with a supporting section for supporting a lead frame to which the first semiconductor integrated circuit chip has been die-bonded and wire-bonded on its one surface while the second semiconductor integrated circuit chip has been die-bonded on the other surface, a clamp plate for pressing the lead frame onto the supporting section, and wire-bonding tools, such as a capillary, for wire-bonding the second semiconductor integrated circuit chip onto the lead frame. Here, the supporting section is characterized by including a rigid member for supporting the lead frame and an elastic member for supporting the first semiconductor integrated circuit chip. In this arrangement, when the second semiconductor integrated circuit chip is wire-bonded onto the lead frame, the circuit-bearing surface of the second semiconductor integrated circuit chip is supported by the elastic member. As a result, it becomes possible to prevent cracks that may be caused in the passivation film on the circuit-bearing surface due to contact with minute protrusions located on the rigid member, concentration of stress caused by foreign matters such as silicone fragments, and other phenomena.

Moreover, in a modified arrangement which features that the rigid member of the supporting section is made of a thermal conductive material having a high thermal conductivity, that the inner section of the rigid member has a hole that penetrates it in the vertical direction, and that the jig used for assembling semiconductor devices has a suction device for sucking air through the hole in the inner section of the rigid member and for making the lead frame adhere to the supporting section, it becomes possible to effectively transmit heat from the heating means to the bonding pads of the second semiconductor integrated circuit chip during the heating process in which the second semiconductor integrated circuit chip is wire-bonded to the lead frame.

In this case, as for materials for the elastic member, it is preferable to use those materials that have elasticity to a resultant force between a wire-bonding load exerted by the capillary and a suction force due to the suction device and also have resistance to heat that is applied by the heating means.

Furthermore, in the case of packaging semiconductor integrated circuit chips on both sides of a lead frame by using the above-mentioned jig used for assembling semiconductor devices, it is preferable to form a protective resin film on the circuit-bearing surface of a semiconductor integrated circuit chip at least within an area that comes into contact with the elastic member. Thus, while the lead frame, which has a semiconductor integrated circuit chip die-bonded on at least one surface thereof, is supported by the jig used for assembling semiconductor devices with the protective resin film and the elastic member being kept in contact with each other, the other semiconductor integrated circuit chip is packaged onto the surface of the lead frame opposite to the surface that is supported by the jig used for assembling semiconductor devices. Even if foreign matter such as silicone fragments, which have a comparatively high hardness and sharp shapes, exist between the supporting face of the elastic member of the jig used for assembling semiconductor devices and the semiconductor integrated circuit chip, this packaging method makes it possible to further absorb and alleviate the concentration of stress onto the circuit-bearing surface (passivation film) of the semiconductor Integrated circuit chip through the elastic deformation of the elastic member and the dumping function of the protective resin film. As a result, it becomes possible to prevent cracks that might be caused on the circuit-bearing surface of the semiconductor integrated circuit chip and also to improve the reliability of semiconductor devices. It is also possible to improve the final yield of semiconductor devices in the manufacturing process.

When the semiconductor integrated circuit chip that is coated with the protective resin film is used, it is preferable to take the following steps: First, a semiconductor integrated circuit chip is die-bonded onto one surface of a lead frame. After completion of a wire-bonding process on the semiconductor integrated circuit chip, the lead frame is turned over to be upside down, and while the lead frame la being supported by the aforementioned jig used for assembling semiconductor devices, a semiconductor integrated circuit chip is die-bonded onto the other surface of the lead frame. Then, the semiconductor integrated circuit chip is subject to a wire-bonding operation. With this packaging method, it is only necessary to form the protective resin film on one of the semiconductor integrated circuit chips that is to be first die-bonded onto the lead frame; this makes it possible to minimize the cost of material for the protective resin film.

For a fuller understanding of the nature and advantages of the invention, reference should be made to the ensuing detailed description taken in conjunction with the accompanying drawings.

BRIEF DESCRIPTION OF THE DRAWINGS

FIGS. 7A–F, hereinafter referred to as FIG. 7, are explanatory drawings that show a flow chart of a schematic sequence of processes wherein semiconductor integrated circuit chips are packaged on both sides of a lead frame.

DESCRIPTION OF THE EMBODIMENTS

Figure 1A:
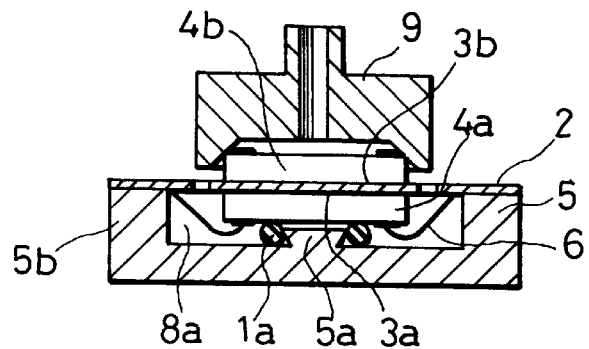
FIGS. 1(a) through 1(d) are explanatory drawings that show a die-bonding operation and a wire-bonding operation of one embodiment of the present invention.

Referring to FIGS. 1(a) through 7, the following description will discuss one embodiment of the present invention.

Additionally, in FIGS. 1(a) through 7, reference numerals 1a and 1b represent elastic members; 2 is a lead frame; 3a is a die pad on the first-surface side; 3b is a die pad on the second-surface side; 4a is the first chip; 4b is the second chip; 5 is a support stage; 5a is an inner section in the support stage; 5b is an outer section in the support stage; 6 represents bonding wires; 8a and 8b are groove sections; 9 is a bonding collet; 10 is a heater block; 10a is an inner section in the heater block 10; 10b is an outer section in the heater block 10; 11 is a clamp plate; 12 is a suction hole; 13 is a passivation film; 14 represents silicone fragments; and 15 are bonding pads.

Referring to FIG. 1, an explanation will be given on a die-bonding operation and a wire-bonding operation in one embodiment of the present invention.

First, in the same manner as in the conventional process, a lead frame 2, which has a die pad 3a on its first surface to which the first chip 4a is die-bonded and wire-bonded, is turned over to be upside down, and is placed on a support stage 5 that is made of a rigid material such as a metallic material of iron group (see FIG. 1(a)).

The support stage 5 is constituted of an outer section 5b, a groove 8a, and an inner section 5a. The internal dimension of the outer section 5b is set to be slightly greater than the external dimension of the first chip 4a. Further, the external dimension of the inner section 5a is designed to be slightly greater than the inner-diameter of an elastic member 1a, which will be described later. The elastic member 1a is positioned by the inner section 5a so as to contact and support a center portion of the circuit-bearing surface of the first chip 4a. Here, the groove section 8a, formed between the inner section 5a and the outer section 5b, is provided so as to protect the first chip 4a that has been subjected to the wire-bonding operation from contacting the bonding wires 6. further, the elastic member 1a functions in such a manner that it maintains the quality of die-bonding (i.e. the strength of die-bonding, and the degree of expansion of Ag paste) when the second chip 4b is die-bonded onto the die pad 3b on the second-surface side of the lead frame 2 that is placed on the support stage 5 by the use of the bonding collet 9. In order to avoid unnecessary contact, the external dimension of the elastic member 1a is set in such a manner that the elastic member 1a is positioned on a slightly inner side from the wire-bonding section of the first chip 4a. Moreover, the height dimension of the elastic member 1a is set to be slightly higher than the height dimension of the inner section 5a, thereby protecting the circuit-bearing surface of the first chip 4a from contacting the surface of the inner section 5a.

Figure 2A:
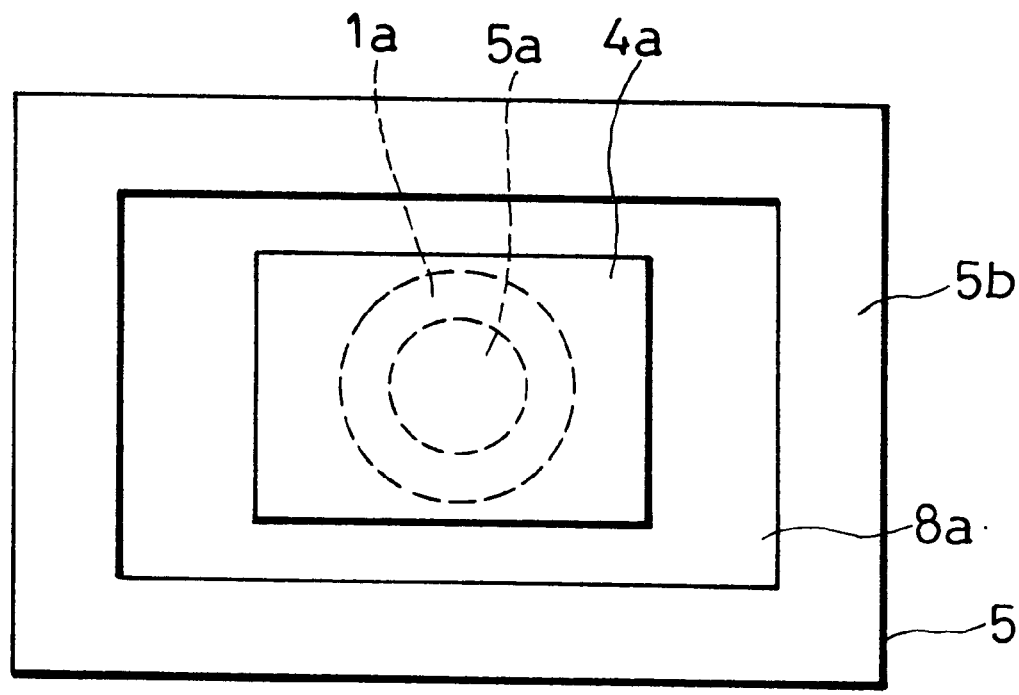
FIG. 2(a) is a plan view showing a support stage and an elastic member that are used during the die-bonding operation of the embodiment of the present invention.
Figure 2B:
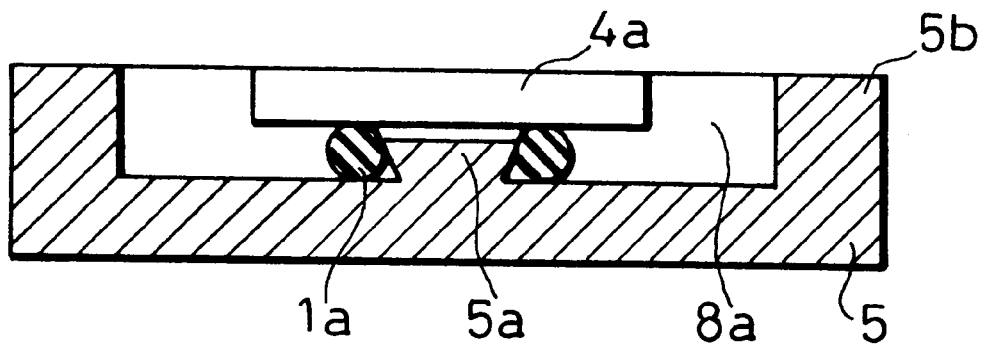
FIG. 2(b) is a cross-sectional view showing the same members as FIG. 2(a).

The following description will discuss the arrangement of the support stage 5 more specifically. As shown in FIG. 2(a), it is preferable to form the elastic member 1a into a ring shape in its external shape in order to reduce the contact area against the passivation film 13 as well as to provide easier positioning and retention. In addition, the elastic member 1a has a round shape or an elliptic shape in its cross-section. As for the elastic member 1a, for example, O rings, which are normally made of materials of rubber-elastomer group and which are widely used in pneumatic equipment, hydraulic equipment and other equipment, may be adopted. These O rings are available on the market.

Moreover, in this case, the die-bonding load and the wire-bonding load need to be set to at least not less than 50 gf, and the heating temperature needs to be set to virtually not less than 200° C. during the wire-bonding operation. Therefore, in the present embodiment, an O ring available on the market (brand name "Kalrez 4079" manufactured by E.I. du Pont de Nemours and Co. (rubber strength: 7.5, JIS size: P3)) is used as the elastic members 1a and 1b. This product, which has elasticity to the die-bonding load and wire-bonding load and also has resistance to the above-mentioned heating temperatures, is capable of reducing adverse effects caused by foreign matters.

Figure 1B:
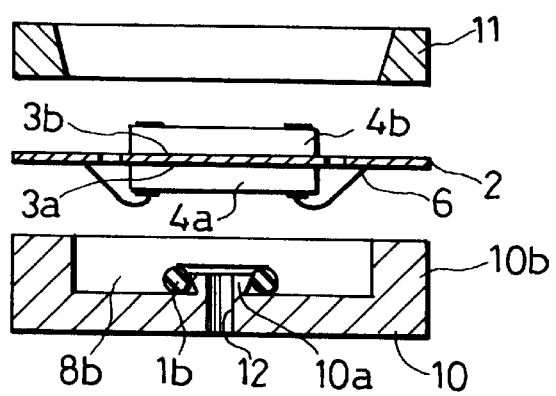
Figure 1C:
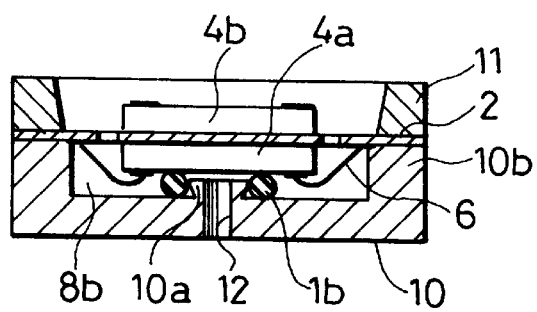
Figure 1D:
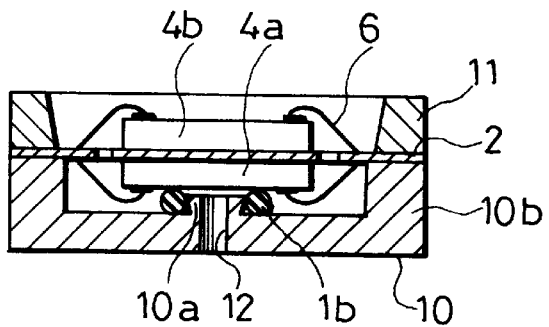

Next, as shown in FIGS. 1(b) through 1(d), after the Ag-paste curing process, the lead frame 2, which has the die pad 3a on its first-surface side on which the first chip 4a has been die-bonded, Ag-paste-cured and wire-bonded, and which also has the die pad 3b on its second-surface side on which the second chip 4b has been die-bonded, is clamped by the heater block 10 and the clamp plate 11 that are made of a rigid material such as a metallic material of iron group. Here, the clamp plate 11 is the same as those conventionally used.

Figure 3A:
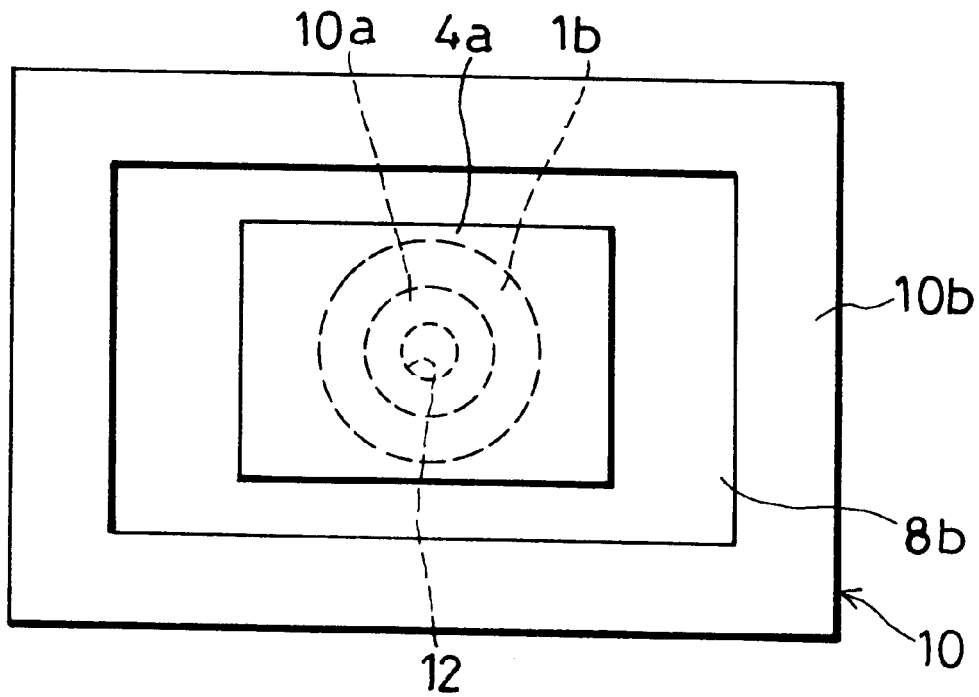
FIG. 3(a) is a plan view showing a heater block and an elastic member that are used during the wire-bonding operation of the embodiment of the present invention.
Figure 3B:
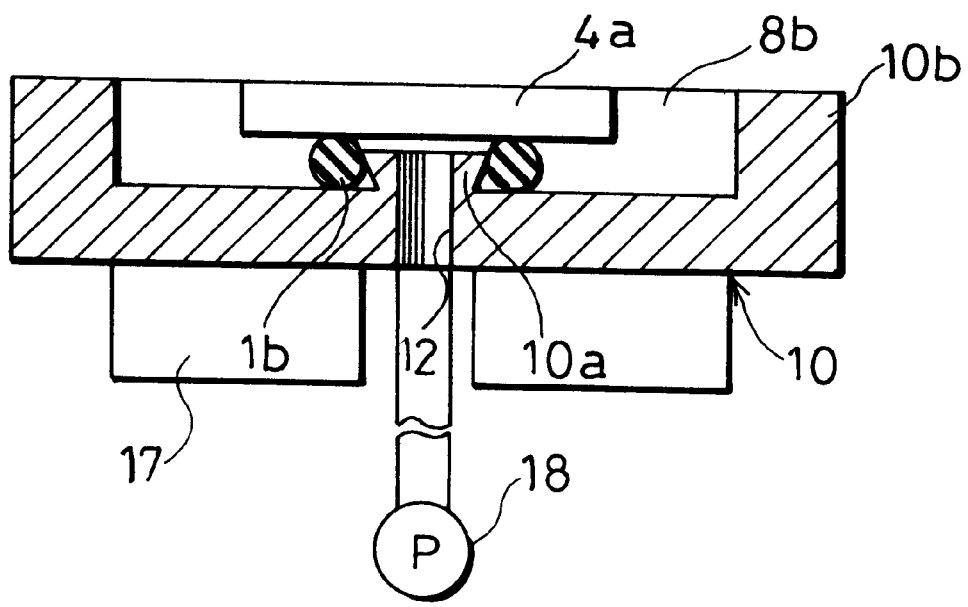
FIG. 3(b) is a cross-sectional view showing the same masers as FIG. 3(a).

As shown in FIGS. 3(a) and 3(b), the heater block 10 is constituted of an outer section 10b, a groove 8b, and an inner section 10a. The internal dimension of the outer section 10b is set to be slightly greater than the external dimension of the first chip 4a. Further, the external dimension of the inner section 10a is designed to be slightly greater than the inner-diameter of the elastic member 1b. The elastic member 1b is positioned by the inner section 10a so as to contact and support a center portion of the circuit-bearing surface of the first chip 4a. Here, the groove section 8b, formed between the inner section 10a and the outer section 10b, is provided so as to protect the first chip 4a that has been subjected to the wire-bonding operation from contacting the bonding wires 6.

Additionally, as for the elastic member 1b, it .is preferable to use materials which have a resistance to heat that is higher than that of the elastic member 1a since there is a heating process in the wire-bonding operation. Here, the heater block 10 is provided with a heater 17 (heating means) and a vacuum air-release pump 18 which is connected to a suction hole 12 that is formed in the center of the inner section 10a and which functions as a means (suction device) for fixing the circuit-bearing surface of the first chip 4a by applying a vacuum suction thereto in order to make thermal transmission from the heater block 10 more efficient.

Moreover, it is necessary to heat the bonding pads of the second chip 4b to a predetermined temperature; therefore, while applying a vacuum suction onto the circuit-bearing surface of the first chip 4a, the bonding pads of the second chip 4b are heated by heat that Is transmitted from the heater block 10 through the elastic member 1b, the first chip 4, and the lead frame 2. In addition, in the same manner as in the conventional arrangement, the clamp plate 11 clamps the lead frame 2 onto the upper surface of the heater block 10 so that the heat from the heater block 10 is transmitted to inner leads on the second-surface side of the lead frame 2. At this time, the circuit-bearing surface of the first chip 4a is subjected to a pressure consisting of a wire-bonding load that is exerted by the capillary (not shown) onto the second chip 4b and a vacuum suction force exerted through the suction hole 12.

Further, the elastic member 1b functions in such a manner that it maintains the quality of wire-bonding (i.e. the strength of wire-bonding, the ball shape, the loop shape, etc.) when a bonding operation is carried out using the bonding wires 6 between the bonding pads of the second chip 4b that has been die-bonded and Ag-paste-cured onto the die pad 3b in the second-surface side of the lead frame 2 and the inner leads on the second-surface side of the lead frame 2.

Next, in the same manner as in the conventional arrangement, after the bonding operation has been carried out using the bonding wires 6 between the bonding pads of the second chip 4b that was die-bonded and Ag-paste-cured onto the die pad 3b on the second-surface side of the lead frame 2 and the inner leads on the second-surface side of the lead frame 2, the first chip 4a and the second chip 4b, which have been packaged onto the surface and the back surface of the lead frame 2, are sealed with materials such as resins. Then, tie bars and side bars are cut off, and outer leads are bent into desired shapes; thus, the product is completed.

Additionally, in the above-mentioned embodiment, the explanation has been given on the elastic members 1a and 1b that have an O-ring shape; however, those members having a plate shape may be adopted, and those members, which have shapes other than a round shape or an elliptic shape in their cross section, may be adopted as long as they have ring shapes. Moreover, as for the materials of the elastic members, other materials may be adopted with the same effects, as long as they have properties, such as elasticity, flexibility and resistance to heat, that are equivalent to those made of the materials of rubber-elastomer group. Furthermore, the bonding pads, formed on the circuit-bearing surface, are not limited to those formed in the two directions, as shown in FIG. 5(a); those formed in the four directions may be applied to the present invention.

In the case of using the conventional jig for die-bonding and wire-bonding, it was confirmed that cracks occur in a passivation film when there are foreign matters (silicone fragments whose particle diameter is approximately φ 50 μm) between the passivation film and the supporting surface (cracks occurred all the 10 tested chips). Here, in the case of the arrangement of the present invention, no cracks occurred under the same conditions.

Figure 4:
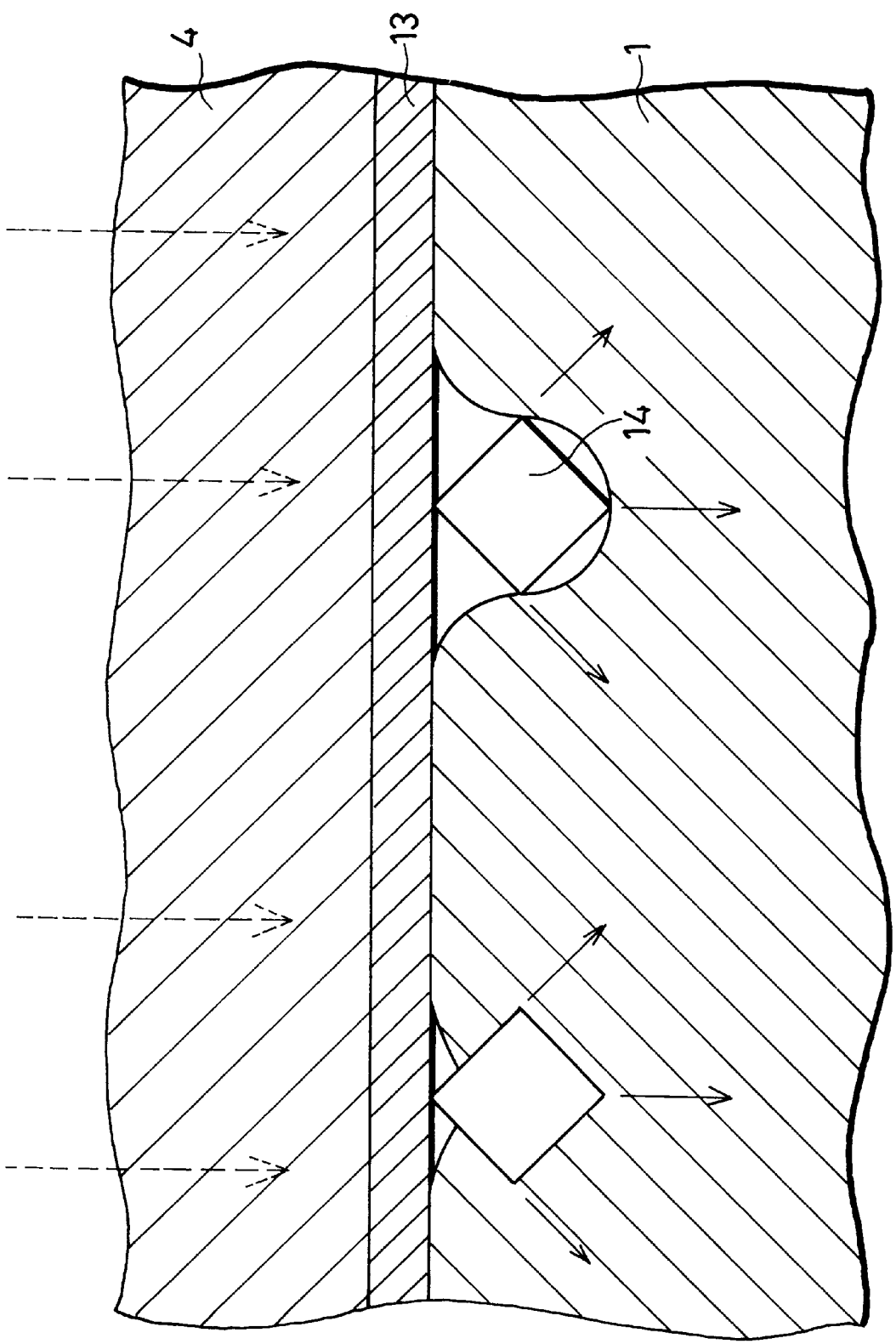
FIG. 4, which is used for explaining the effects of the present invention, is a cross-sectional view that shows how foreign matters reside between a passivation film and a supporting surface.

As described above in detail, the present invention features an arrangement wherein the circuit-bearing surface of the first chip is contacted and supported by the supporting face of the elastic member that is positioned at the groove section formed in the upper surface of each of the support stage and the heater block. This arrangement makes it possible to prevent the passivation film from partially contacting the largest protruding portion on the surface of each of the support stage and the heater block that have been formed through machining processes, from the physical point of view, thereby reducing cracks that may be caused in the passivation film Moreover, as shown in FIG. 4, even if foreign matter such as silicone fragments, which have a comparatively high hardness and sharp shapes and which include a largest possible fragment 14, exist between the passivation film 13 and the supporting face of the elastic member, it is possible to prevent the passivation film 13 from partially contacting the fragment 14 directly, since the supporting face of the elastic member 1 is locally deformed elastically. Thus, the elastic member 1 absorbs and alleviates the concentration of stress, thereby making it possible to prevent cracks that may be caused in the passivation film 13.

Figure 5A:
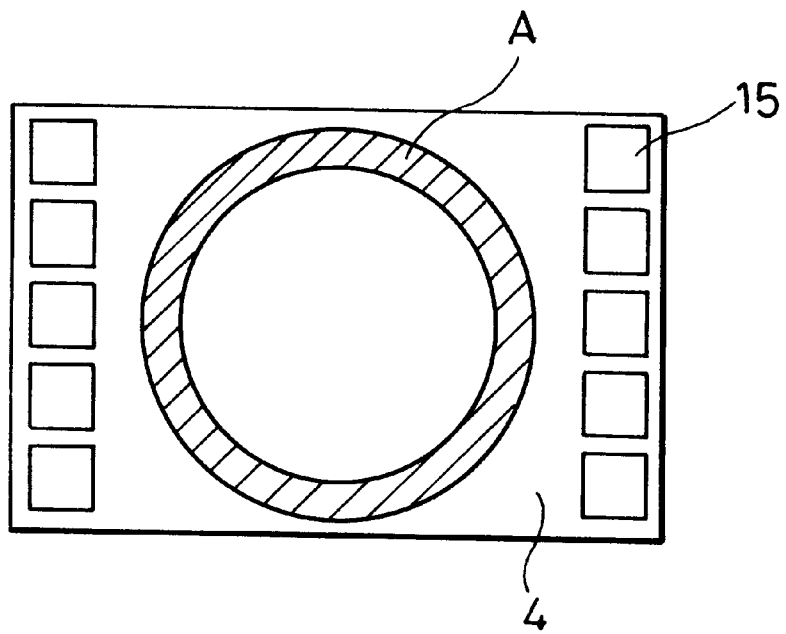
FIG. 5(a) is a drawing that shows the contact area between the passivation film and the supporting surface of the present invention.
Figure 5B:
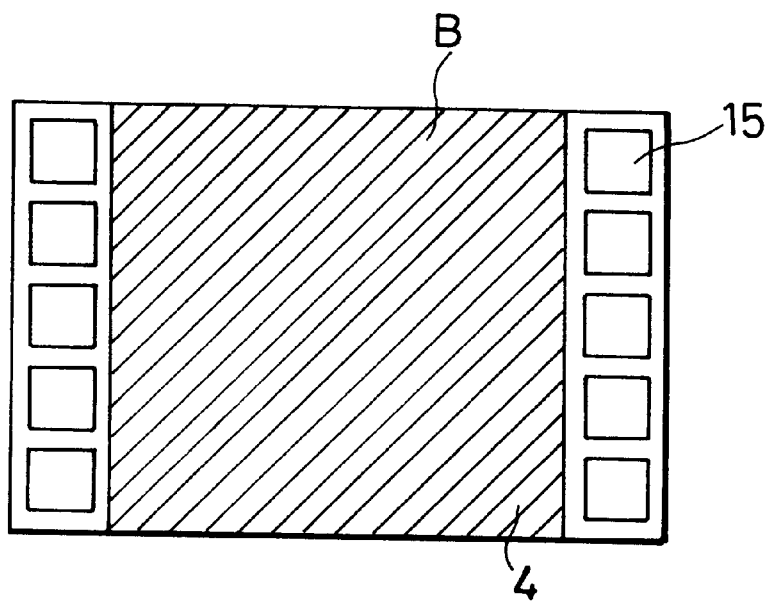
FIG. 5(b) is a drawing that shows the contact area in a conventional arrangement.

Furthermore, as for the size of the contact area, that is, the supported area in the passivation film, it corresponds to the surfaces of the support stage and the heater block as shown in FIG. 5(b) in the conventional arrangement (portion B indicated by oblique hatching in FIG. 5b)), while in the present invention, it corresponds to the supporting face of the elastic member as shown in FIG. 5(a) (portion A indicated by oblique hatching in FIG. 5(a)). Thus, the present invention reduces to a great degree the size of the contact area, that is, the supported area in the passivation film, compared to the conventional arrangement. In this arrangement, supposing that the number of parts of foreign matter per 1 mm$^2$ existing between the passivation film and the supporting face of the elastic member or the surfaces of the support stage and the heater block is the same, the arrangement of the present invention is less susceptible to adverse effects from the foreign matters than the conventional arrangement.

Figure 6:
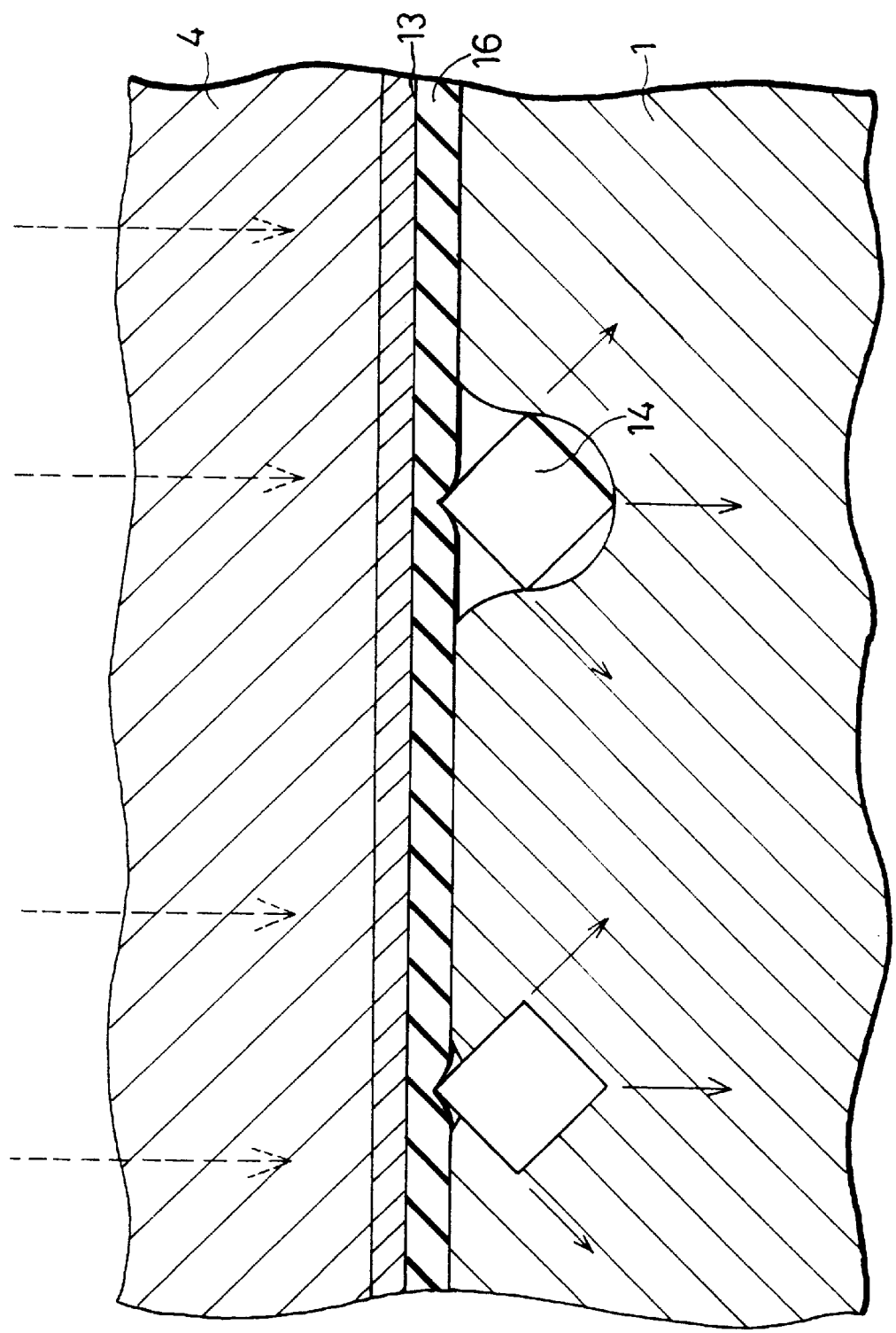
FIG. 6, which explains the effects of another embodiment of the present invention, is a cross-sectional view that shows a case where foreign matters exist between the supporting face of a jig used for assembling semiconductor devices and a semiconductor integrated circuit chip.
Figure 7A:
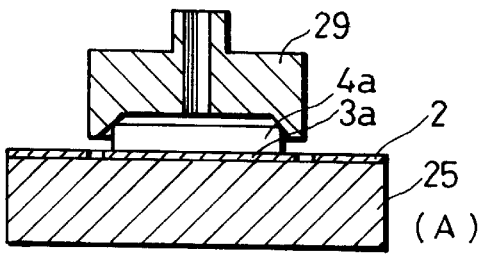
Figure 7A:
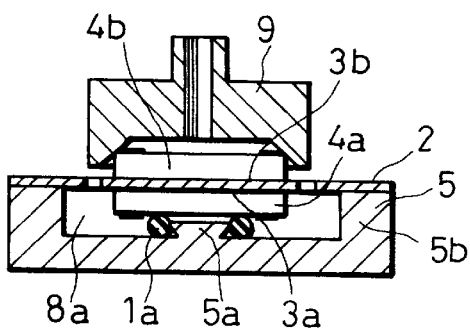
Figure 7A:
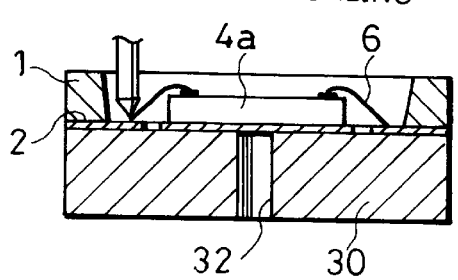
Figure 7A:
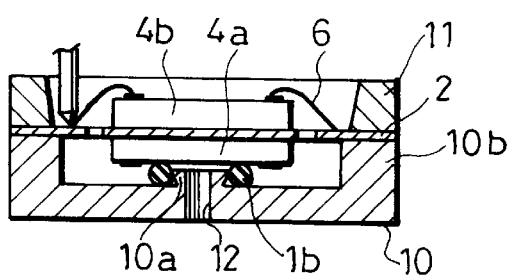
Figure 7A:
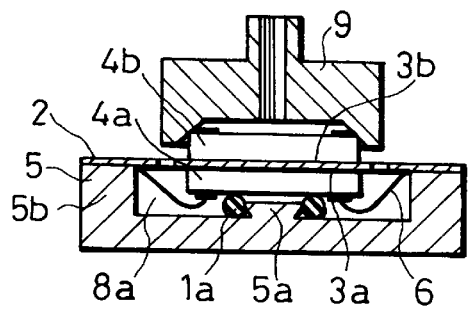
Figure 7A:
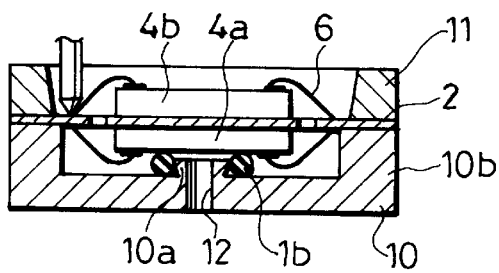
Figure 8A:
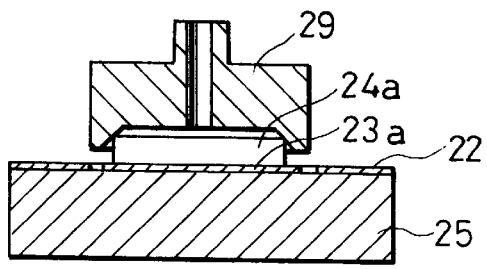
FIGS. 8(a) through 8(h) are drawings that show a die-bonding operation and a wire-bonding operation in the conventional arrangement.
Figure 8E:
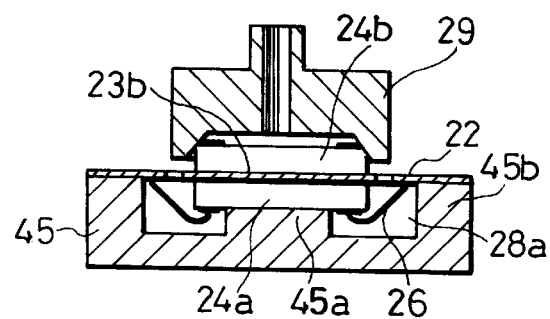
Figure 8B:
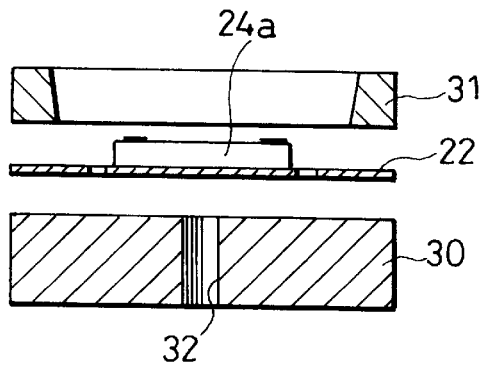
Figure 8F:
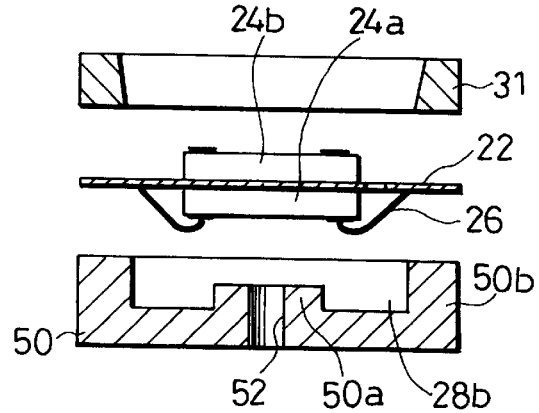
Figure 8C:
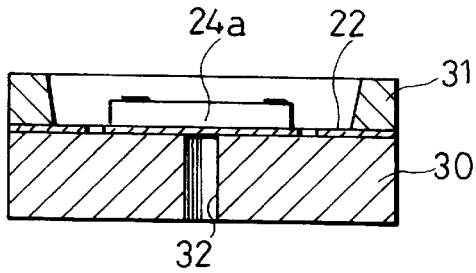
Figure 8G:
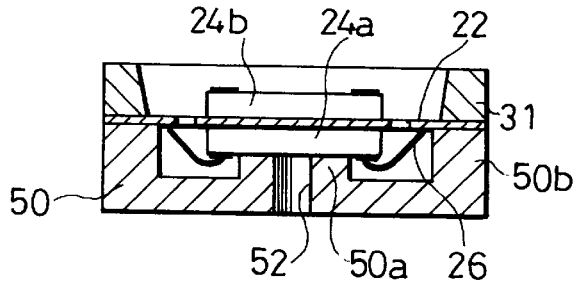
Figure 8D:
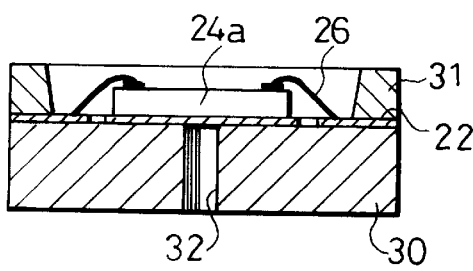
Figure 8H:
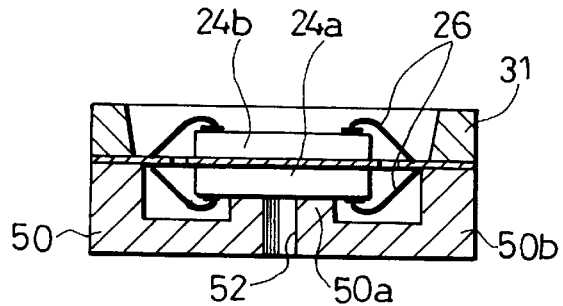
Figure 9A:
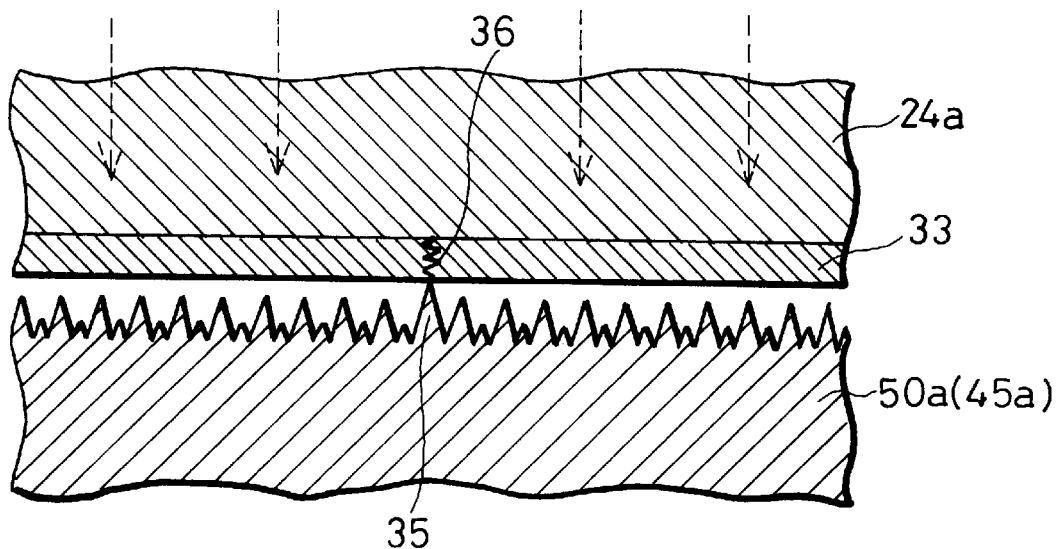
FIG. 9(a) is an explanatory drawing that shows a principle as to how cracks develop in a passivation film due to a conventional die-bonding jig as well as a conventional wire-bonding jig.
Figure 9B:
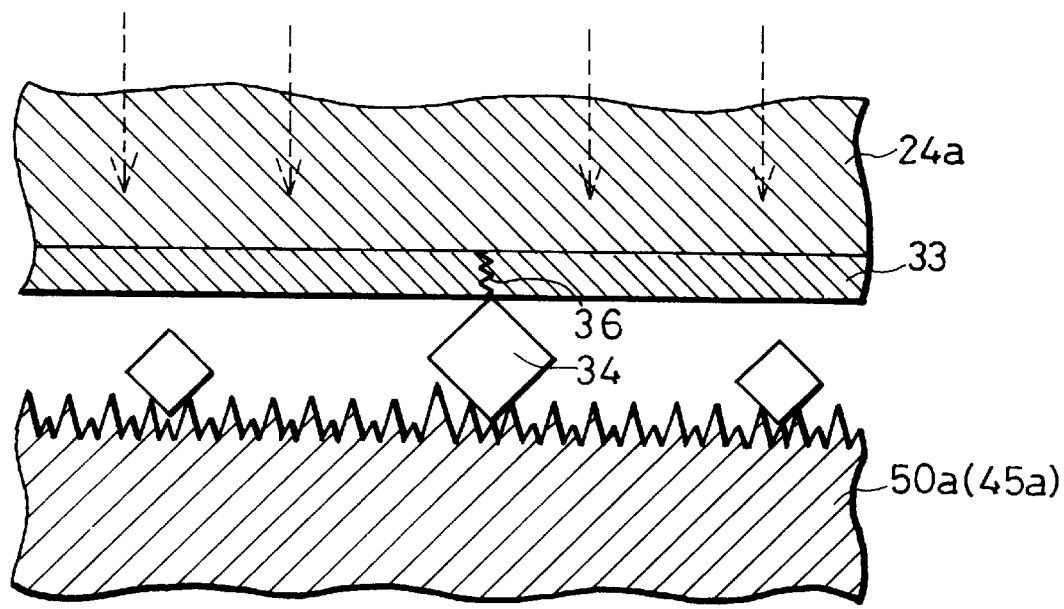
FIG. 9(b) is an explanatory drawing that shows a principle as to how cracks occur in a passivation film due to the ingress of foreign matter in a conventional arrangement.

Meanwhile, in the case of packaging chips on both sides of a lead frame 2 by using the jig used for assembling semiconductor devices that is provided with the elastic member 1a or 1b, it is preferable to form a protective resin film 16 having a thickness in the order of several $\mu$m on the passivation film 13 on the circuit-bearing surface of the chip 4, as shown in FIG. 6. This arrangement makes it possible to reduce cracks in the passivation film more effectively, as will be described later.

As for the protective film 16 for coating the passivation film 13 of the chip 4, those materials, such as polyimide resin and silicone resin, that do not cause adverse effects on the chip 4 are applicable.

The protective resin film 16 is formed at least within an area that comes into contact with the elastic member 1 of the jig used for assembling semiconductor devices on the circuit-bearing surface of the chip 4, and the other portions to be exposed, such as bonding pads, are left uncovered.

In the case of forming the protective resin film on the circuit-bearing surface of the chip, it is preferable to form the protective resin film, such as a polyimide film, on the passivation film in a wafer state and to produce individual semiconductor integrated circuit chips by cutting off the wafer later. As for the manufacturing method for the protective film the spin coating method, wherein varnish-like protective resin is dropped onto a wafer having masked aperture portions and is applied thereto by rotating the wafer, the screen printing method, and other methods are adopted.

With this arrangement where the protective resin film 16 is formed on the passivation film 13 of the chip 4, when a lead frame 2, on which the chip 4 is die-bonded, is set on the support stage 5 or the heater block 10, the elastic member 1 comes into contact with the protective resin film 16 as shown in FIG. 6. In this case, even if foreign matter 14 such as silicone fragments, which have a comparatively high hardness and sharp shapes, exist between the supporting face of the elastic member 1 and the protective resin film 16, it is possible to further absorb and alleviate the concentration of stress that is exerted onto the passivation film 13 at the positions where the foreign matters 14 are located, thereby making it possible to prevent cracks that might occur in the passivation film 13 more effectively.

Next, tests were carried out to examine the incidence rate of cracks in the passivation film 13 in relation to the size of foreign matter (silicone fragments) while the film thickness of a polyimide film, provided as the protective resin film 16, was varied. The results of the tests are shown in Tables 1 through 3. Table 1 indicates the incidence rate of cracks when a support stage 5 having the elastic member 1a was used in a die-bonding operation. Here, the tests were made in respective cases where scrubbing is conducted and it is not conducted during the die-bonding operation. Table 2 indicates the incidence rate of cracks when a heater block 10 having the elastic member 1b was used in a wire-bonding operation. Table 3, which shows comparative examples, indicates the incidence rate of cracks when a conventional heater block without an elastic member was used in a wire-bonding operation. In the respective Tables, the denominator of the value of the incidence rate of cracks represents the total number of chips that were subject to the tests, and the numerator thereof represents the number of chips wherein cracks occurred.

TABLE 1

Incidence rate of cracks in a passivation film during a die-bonding operation (using a support stage having an elastic member).

| Film Thickness: | Size of Foreign Matter | | | |
| --- | --- | --- | --- | --- |
| Polyimide | 0 $\mu$m | 65 $\mu$m | 80 $\mu$m | 95 $\mu$m |
| 0 $\mu$m | | | 4/10(4/10) | |
| 3 $\mu$m | 0/10 | 2/10(0/10) | 2/10(2/10) | 4/10(0/10) |
| 10 $\mu$m | | 0/10(0/10) | 0/10(0/10) | 0/10(0/10) |
| 15 $\mu$m | | | 0/10(0/10) | |
| 20 $\mu$m | | 0/10(0/10) | 0/10(0/10) | 0/10(0/10) |

(): without Scrubbing

TABLE 2

Incidence rate of cracks in a passivation film during a wire-bonding operation (using a support stage having an elastic member).

| Film Thickness: | Size of Foreign Matter | | | | | |
| --- | --- | --- | --- | --- | --- | --- |
| Polyimide | 0 $\mu$m | 50 $\mu$m | 65 $\mu$m | 80 $\mu$m | 95 $\mu$m | 110 $\mu$m |
| 0 $\mu$m | 0/10 | 1/10 | 6/10 | 10/10 | | |
| 3 pm | 1/10 | 0/10 | 0/10 | 2/10 | 0/10 | |
| 10 $\mu$m | | | 0/20 | 0/20 | 0/20 | 1/10 |

TABLE 2-continued

Incidence rate of cracks in a passivation film during a wire-bonding operation (using a support stage having an elastic member).

| Film Thickness: Polyimide | Size of Foreign Matter | | | | |
|---|---|---|---|---|---|
| | 0 μm | 50 μm | 65 μm | 80 μm | 95 μm | 110 μm |
| 15 μm | | | 0/10 | 0/10 | 0/20 | |
| 20 μm | | | 0/10 | 0/10 | 0/10 | |

TABLE 3

Incidence rate of cracks in a passivation film during a wire-bonding operation (using a conventional support stage).

| Film Thickness: Polyimide | Size of Foreign Matter | | | | | |
|---|---|---|---|---|---|---|
| | 0 μm | 50 μm | 65 μm | 80 μm | 95 μm | 110 μm |
| 0 μm | | 6/10 | 10/10 | 6/10 | 10/10 | |
| 3 μm | | 1/10 | 10/10 | 10/10 | 10/10 | |
| 10 μm | | | | | | |
| 15 μm | | | | | | |
| 20 μm | | | | | | |
| * 35 μm | | 0/10 | | | 6/10 | |

* using polyimide tape of 10 μm with bonding agent

As clearly indicated by Table 1 and Table 2, in the case of carrying out a die-bonding operation or a wire-bonding operation on the chip 4 wherein a polyimide film of approximately 10 μm is formed on the passivation film 13 as a protective resin film 16, cracks do not occur even when silicone fragments with a particle diameter of approximately 100 μm exist between the polyimide film and the supporting face of the elastic member 1.

Here, after the chips have been packaged on both sides of the lead frame 2, the entire chips are sealed with a sealing material such as resin in the next molding process; therefore, the protective resin film 16, formed on the surface of the chip, may be sealed together with the chips without the necessity of removing it therefrom.

Meanwhile, in the case of packaging semiconductor integrated circuit chips on both sides of the lead frame 2, it is necessary to conduct two times of die-bonding processes as well as two times of wire-bonding processes. In this case, two possible sequences of the processes are proposed as shown in FIG. 7.

One of the sequences of processes is flow A that is shown on the right side of FIG. 7, wherein: after the first die-bonding process for die-bonding the first chip 4a onto one surface (the first surface) on the lead frame 2, the first wire-bonding process for wire-bonding the first chip 4a is carried out; after the lead frame 2 has been turned over upside down, the second die-bonding process is carried out so that the second chip 4b is die-bonded onto the other surface (the second surface) of the lead frame 2; and then the second wire-bonding process for wire-bonding the chip 4b is carried out (die-bonding—wire-bonding—die-bonding—wire-bonding).

The other sequence of processes is flow B that is shown on the left side of FIG. 7, wherein: after the first die-bonding process has been carried out in the same manner as described above, the lead frame 2 is turned over upside down and the second die-bonding process is carried out; and then the first wire-bonding process and the second wire-bonding process are successively carried out (die-bonding—die-bonding—wire-bonding—wire-bonding).

By the use of the jig used for assembling semiconductor devices of the present invention, it is possible to prevent cracks that might occur in the passivation film in any of the flows of processes. however, in the case of using the semiconductor integrated circuit chips coated with the protective resin film as described earlier, it is preferable to take the flow of processes (the flow of processes shown on the right side of FIG. 7) wherein after completion of die-bonding and wire-bonding processes on the first chip 4a, die-bonding and wire-bonding processes are carried out on the second chip 4b. The reason for this is given as follows:

In the case of the flow of processes shown on the left side of FIG. 7, the turning over of the lead frame 2 is carried out several times, and both of the circuit-bearing surfaces of the first chip 4a and the second chip 4b have to be supported by the jig used for assembling semiconductor devices; therefore, it is necessary to form protective resin films on both the first chip 4a and the second chip 4b. In contrast, in the case of the flow of processes shown on the right side of FIG. 7, the turning over of the lead frame is required only once when the sequence proceeds from the first wire-bonding process to the second die-bonding process. Since the die-bonding and wire-bonding processes for the first chip 4a have been completed before the packaging process of the second chip 4b, it is not necessary to support the circuit-bearing surface of the second chip 4b by using the jig used for assembling semiconductor devices. Therefore, in this case, the protective resin film needs to be formed only on the first chip 4a, and no protective resin film is necessary on the second chip 4b. In other words, the flow of processes shown on the right side of FIG. 7 cuts the cost of the material for protective resin film more effectively than the flow of processes shown on the left side of FIG. 7, thereby making it possible to reduce the cost of production.

Moreover, in the present embodiment, It is possible to prevent cracks in the passivation film without the necessity of inserting extra processes, such as a molding process, into the flow of the both-sides packaging processes (Here, a curing process and an inspection process after the die-bonding process are excluded). Therefore, different from the manufacturing method disclosed in the aforementioned Japanese Patent Publication No. 121462/1993 (Tokukaihei 5-121462), there is no possibility of adverse effects on the working environment caused by processes other than the die-bonding and wire-bonding processes, and it is possible to maintain clean working environment wherein the die-bonding and wire-bonding operations are carried out.

As described above, it becomes possible to prevent cracks that may be caused in the passivation film and also to improve the reliability and the final yield of semiconductor devices.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A jig used for assembling semiconductor devices comprising:
   a rigid member having an effective rigidity property for supporting a first surface of a lead frame attached to a first surface of a first semiconductor integrated chip, and an elastic member having an effective elastic property to support the semiconductor integrated circuit chip from said first surface, so that the elastic member can maintain a gap between the first semiconductor integrated chip and the rigid member to protect the first surface of the first semiconductor integrated chip from destructive contact effects of the rigid member.

2. The jig used for assembling semiconductor devices as defined in claim 1, wherein the first semiconductor integrated circuit chip has been wire-bonded onto the lead frame and the elastic member is arranged to come into contact with an inner side from the wire-bonded section of the first semiconductor integrated circuit chip.

3. The jig used for assembling semiconductor devised as defined in claim 1, further comprising a bonding collet for die-bonding a second semiconductor integrated circuit chip onto a second surface of the lead frame,
wherein the elastic member is made of an elastic material that has an elastic property effective to support a bonding load that may be applied by the bonding collet.

4. The jig used for assembling semiconductor devices as defined in claim 3, wherein the elastic material has an elastic strength effective to support a bonding load of at least 50 gf.

5. A jig used for assembling semiconductor devices comprising:
a supporting section for supporting a first surface of a lead frame to which a first surface of a first semiconductor integrated circuit chip is attached and the semiconductor integrated chip having a wire attached on its first surface while a second semiconductor integrated circuit chip is attached on a second surface of the lead frame; and
a clamp plate for pressing the lead frame onto the supporting section,
wherein the supporting section includes a rigid member having an effective rigidity property for supporting the lead frame and an elastic member having an effective elastic property for supporting the first semiconductor integrated circuit chip, so as to maintain a gap between the first semiconductor integrated chip and the rigid member to protect the surface of the first semiconductor integrated chip from destructive contact effects of the rigid member.

6. A jig used for assembling semiconductor devices comprising:
a supporting section for supporting a lead frame which includes a first semiconductor integrated circuit chip attached to a first surface of the lead frame and having a wire bonded on one surface of the first semiconductor while a second semiconductor integrated circuit chip is attached on a second surface of the lead frame; and
a clamp plate for pressing the lead frame onto the supporting section,
wherein the supporting section includes a rigid member having an effective rigidity property so that it can support the lead frame and an elastic member having an effective elastic property, so that it can support the first semiconductor integrated circuit chip, wherein the elastic member has a ring-shape and the rigid member has an outer section capable of supporting the lead frame and an inner section that has a height lower than that of the ring-shaped elastic member, that is, to be located at a position corresponding to a lower part of the first semiconductor integrated circuit chip, with the outer section supporting the lead frame to which the first semiconductor integrated circuit chip is attached, the ring-shaped elastic member having a dimension to fit around the inner section,
wherein the rigid member of the supporting section is made of a thermal-conductive material having a sufficient thermal conductivity to allow heat from a heating means to pass therethrough and the inner section of the rigid member has a through hole in a vertical direction, said jig used for assembling semiconductor devices further including:
a heating means for heating the rigid member; and
a suction device for allowing the lead frame to adhere to the supporting section by sucking air from the hole formed in the inner section of the rigid member,
wherein the elastic member has an elastic property to a resultant force between a wire-bonding load and a suction force exerted by the suction device, and the elastic member is made of a material having heat resistance that is sufficient to prevent destructive effects by heat that is applied by the heating means,
wherein said material has an elastic property sufficient to support a load of at least 50 gf, and also has a resistance to heat sufficient to withstand the destructive effects by heat of at least 200° C.

7. The jig used for assembling semiconductor devices as defined in claim 6, wherein the elastic member has a round shape in its cross section.

8. The jig used for assembling semiconductor devices as defined in claim 6, wherein the elastic member has an elliptic shape in its cross section.

9. A jig used for assembling semiconductor devices, for supporting a semiconductor device having a lead frame and a first semiconductor integrated circuit chip attached to a first surface of said lead frame, said jig used for assembling semiconductor devices comprising:
a chip supporting section for supporting said first semiconductor integrated circuit chip of said semiconductor devices;
a first frame supporting section for positioning said chip supporting section; and
a second frame supporting section provided around a perimeter of said first frame supporting section, for supporting said lead frame;
wherein said chip supporting section has an elasticity set within a range such that, when force of a predetermined amount is applied to said semiconductor device in a direction toward said jig for assembling semiconductor devices, a gap is maintained between said first frame supporting section and said semiconductor device, and local elastic deformation is possible.

10. A jig used for assembling semiconductor devices, for supporting a semiconductor device having a lead frame and a first semiconductor integrated circuit chip attached to a first surface of said lead frame, said jig used for assembling semiconductor devices comprising:
a chip supporting section for supporting said first semiconductor integrated circuit chip of said semiconductor devices, placed in such a position as to contact the first semiconductor integrated circuit chip when the semiconductor device is placed at a predetermined supporting position;
a positioning section for positioning the chip supporting section;
a frame supporting section which, when the semiconductor device is placed at the supporting position, is placed in such a position as to contact the lead frame of the semiconductor device at a position on the first surface to which the first semiconductor circuit chip is not joined so as to support the lead frame;

force-applying means for applying a force having a predetermined magnitude to the semiconductor device placed at the supporting position in a direction so as to allow the semiconductor device to approach the chip supporting section and the frame supporting section;

wherein the positioning section and the frame supporting section are made from a material different from the chip supporting section, the chip supporting section has an elasticity in such a range that it maintains a gap between the positioning section and the first semiconductor circuit chip while the force-applying means is applying the force to the semiconductor device, and is allowed to have a partial elastic deformation, and the frame supporting section has a rigidity in such a range that it is not allowed to have a partial elastic deformation while the force-applying means is applying the force to the semiconductor device.

* * * * *

UNITED STATES PATENT AND TRADEMARK OFFICE
CERTIFICATE OF CORRECTION

PATENT NO.     : 6,423,102 B1
DATED          : July 23, 2002
INVENTOR(S)    : Fukunaga et al.

It is certified that error appears in the above-identified patent and that said Letters Patent is hereby corrected as shown below:

Column 2,
Between lines 20 and 21, insert a line -- Non-Patent Documents, -- and under that line insert the following -- *Microelectronics Packaging Handbook, New York, Van Nostrand Reinhold, 1989. pp. 540-541. TK7874.T824, 1988. --

Signed and Sealed this

First Day of April, 2003

JAMES E. ROGAN
*Director of the United States Patent and Trademark Office*